United States Patent
Koide

(10) Patent No.: US 7,212,422 B2
(45) Date of Patent: *May 1, 2007

(54) STACKED LAYERED TYPE SEMICONDUCTOR MEMORY DEVICE

(75) Inventor: Yasunori Koide, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/038,526

(22) Filed: Jan. 21, 2005

(65) Prior Publication Data

US 2005/0162946 A1      Jul. 28, 2005

(30) Foreign Application Priority Data

Jan. 21, 2004   (JP)   ............................. 2004-013574

(51) Int. Cl.
*G11C 5/02*   (2006.01)

(52) U.S. Cl. ............................. 365/51; 365/52; 365/63; 365/225.7

(58) Field of Classification Search ................. 365/51, 365/52, 63, 225.7
See application file for complete search history.

(56) References Cited

U.S. PATENT DOCUMENTS 5,561,622 A * 10/1996 Bertin et al. ................... 365/51
6,791,175 B2   9/2004 Matsuo et al.
7,099,173 B2 * 8/2006 Koide ........................ 365/51

FOREIGN PATENT DOCUMENTS

| JP | A 63-168895 | 7/1988 |
|---|---|---|
| JP | 05-063138 A | 3/1993 |
| JP | A 2003-7963 | 1/2003 |
| JP | A 2003-110086 | 4/2003 |
| JP | A-2003-163326 | 6/2003 |
| KR | 2003-41070 | 5/2003 |

* cited by examiner

*Primary Examiner*—Huan Hoang
(74) *Attorney, Agent, or Firm*—Oliff & Berridge, PLC

(57) ABSTRACT

To provide laminated type semiconductor memory devices that can improve the yield of chips without complicating wirings and components. There are provided a plurality of laminated semiconductor chip layers, and chip selection pads provided on each of the chip layers, which are mutually connected across the chip layers, respectively, such that a chip selection signal for selecting each of the chip layers is commonly inputted in each of the chip layers. Each of the chip layers is equipped with program circuits each of which is capable of programming an output signal, and a chip selection judging circuit that judges a chip selection based on the chip selection signal and an output signal of the program circuit. As a result, address information can be set afterwards by the program circuit, such that one kind of chips may suffice in the chip manufacturing stage. Because the chip selection signal is inputted in the common chip selection pads, independent wirings for the respective chips are not required.

8 Claims, 3 Drawing Sheets

PG1

PG1'

(C1)     (C2)     (C3)     (C4)

STACKED LAYERED TYPE SEMICONDUCTOR MEMORY DEVICE

BACKGROUND

The present invention relates to semiconductor memory devices such as ferroelectric memory devices, and more particularly to a packaging technology in which a plurality of semiconductor chips are laminated, thereby achieving a three-dimensional mounting to multiply a per area memory capacity by the number of layers of the laminated chips, and a technology that makes it possible to optionally select each of the chip layers.

Laminating a plurality of semiconductor chips is known to make a semiconductor integrated circuit to have a higher density. In order to drive the laminated semiconductor chips, it is necessary to provide a structure for selecting as to which one of the chips in the layers is made active. For example, Japanese Laid-open Patent Application HEI 5-63138 describes a structure in which one ends of lead lines are connected to semiconductor chips laminated on a carrier substrate, respectively, and the other ends of the lead lines are connected to conductive pins provided standing on the carrier substrate.

[Patent Document 1] Japanese Laid-open Patent Application HEI 5-63138.

However, the structure described in the aforementioned Japanese Laid-open Patent Application HEI 5-63138 is complex because the laminated chips need to be connected individually to the lead lines and the conductive pins, respectively, which increase the number of wirings and the number of components.

To avoid such problem, each of the chips may be provided with a structure that can be discriminated from the other chips. However, to discriminate the chips one from the other, different kinds of chips need to be manufactured. In this case, there are problems, such as, a lack of economy, because different metal masks are required for manufacturing different chips, and if the yield of chips only in one type is lower, the other chips may remain as excesses.

It is an object of the present invention to solve the problems of the conventional technology described above, and provide laminated type semiconductor memory devices that can improve the yield of chips without complicating wirings and components.

SUMMARY

To solve the problems described above, a semiconductor memory device in accordance with the present invention pertains to a semiconductor memory device having a plurality of laminated semiconductor chip layers, and is equipped with a chip selection pad provided on each of the chip layers, the chip selection pads mutually connected across the chip layers such that a chip selection signal for selecting each of the chip layers is commonly inputted in each of the chip layers. Each of the chip layers is equipped with a program circuit that is capable of programming an output signal, and a chip selection judging circuit that judges a chip selection based on the chip selection signal and an output signal of the program circuit. As a result, different chips do not need to be manufactured according to the stages where the chips are provided; and after the chips are manufactured, the program circuit can be programmed to set an address for selecting each of the chips, such that the yield of chips can be improved.

In the semiconductor memory device described above, the program circuit may preferably be equipped with a fuse that can be cut, and a logical circuit that is connected to the fuse and outputs a signal that differs depending on whether the fuse is cut or not cut. As a result, the program circuit can be realized with a simple circuit structure.

In the semiconductor memory device described above, the chip selection judging circuit may preferably be equipped with an exclusive OR circuit that judges a corresponding state between the chip selection signal and an output signal of the program circuit. As a result, a judgment on chip selection can be done swiftly only with hardware.

In the semiconductor memory device described above, the chip selection pad in each of the chip layers may preferably be formed at the same position in each of the chip layers. By so doing, only an electrode that penetrates the chips needs to be provided for connecting the chip selection pads among the chips, such that connection among the chips become facilitated. Also, the chips are formed with an identical structure, such that the yield of chips can be improved.

In the semiconductor memory device described above, each of the chip layers may preferably be equipped with an identical element arrangement. By this, the chips become identical with each other, and the yield of chips is improved.

In the semiconductor memory device described above, a plurality of the chip selection pads may preferably be provided on each of the chip layers and connected to the chip selection judging circuit, wherein the corresponding chip selection pads are mutually connected across the plurality of chip layers, and the chip selection judging circuit may preferably be equipped with the program circuits in the number corresponding to the number of the chip selection pads, and judge a corresponding state between the chip selection signal inputted in each of the chip selection pads and an output signal of each of the corresponding program circuits. As the plurality of chip selection pads are provided, chips in the number more than the number of the chip selection pads may be laminated, and each of the chips can be discriminated.

The semiconductor memory device described above may preferably be further equipped with a chip enable pad that is provided on each of the chip layers, the chip enable pads mutually connected across the chip layers such that a chip enable signal for driving each of the chips is commonly inputted in each of the chip layers, wherein, when the chip selection signal and the chip enable signal are inputted, the chip enable signal may preferably be made effective in any of the chip layers where the chip selection signal matches the output signal of the program circuit. By adding the chip enable signal, a state in which any of the chips are always selected by the chip selection signal can be avoided. By using n number of the chip selection pads, a chip selection signal in n-bits can be fully utilized, and thus $2^n$ chips may be laminated and the individual chips can be discriminated from one another.

An electronic apparatus in accordance with the present invention is characterized in comprising the semiconductor memory device recited above. For this reason, an electronic apparatus equipped with a memory means having a small area and a large capacity can be provided at low costs.

DETAILED DESCRIPTION OF EMBODIMENTS

Next, embodiments of the present invention are described with reference to the accompanying drawings.

<1. Lamination of Semiconductor Memory Devices>

Figure 1:
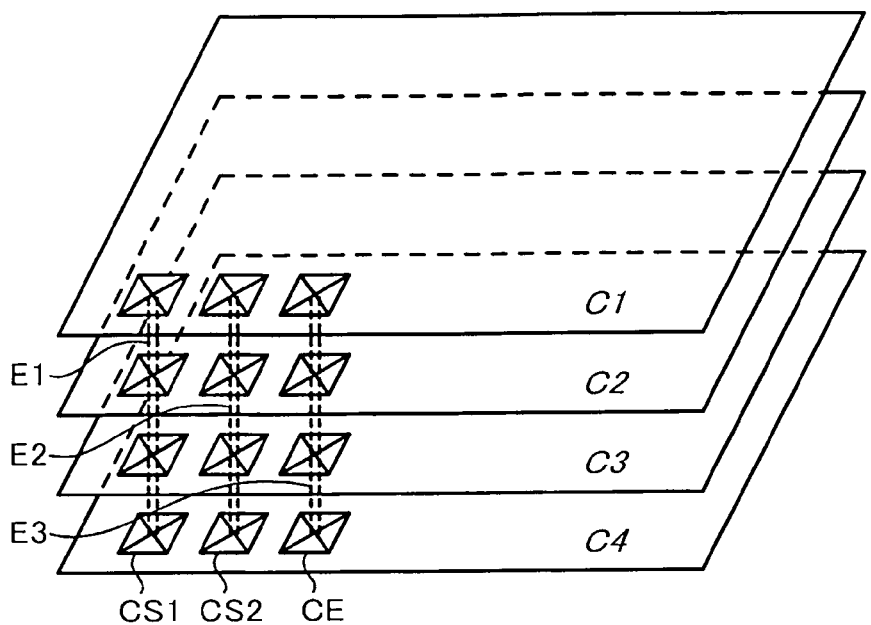
FIG. 1 is a schematic perspective view of a laminated type semiconductor memory device in accordance with an embodiment of the present invention.

FIG. 1 is a schematic perspective view of a three-dimensional mounting, which is an example of a laminated type semiconductor memory device in accordance with an embodiment of the present invention. The semiconductor memory device includes laminated four identical memory cell array chips C1–C4, so that a four-fold memory capacity per area can be obtained. The chips C1–C4 correspond to chip layers in accordance with the present invention.

On each of the chips C1–C4, a plurality of chip selection pads CS1, CS2, and a chip enable pad CE are formed. Also, though not illustrated in FIG. 1 for simplification, other pads necessary for memory operations, such as, for example, pads for addresses and I/O, control pads and the like are also formed. The number of the chip selection pads can be designed optionally according to the number of chips to be laminated. In the chips C1–C4, all of the corresponding pads in all of the chips are mutually, electrically connected by electrodes that penetrate the pads, respectively, such that the same signals can be inputted, respectively. In other words, a part of the chip selection signal is inputted in the chip selection pads CS1 of the respective chips, another part of the chip selection signal is inputted in the chip selection pads CS2 of the respective chips, and a chip enable signal is inputted in the chip enable pads CE of the respective chips.

Figure 2:
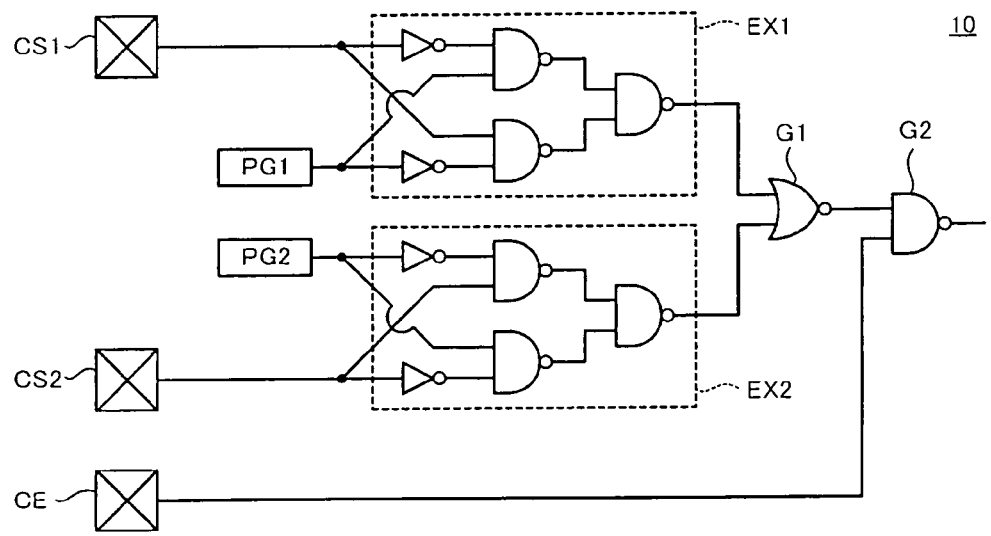
FIG. 2 is a logical diagram of a chip selection judging circuit 10 provided on each chip.

On each of the chips C1–C4, a chip selection judging circuit to be described below with reference to FIG. 2 is formed, and the chip selection judging circuit is connected to the pads CS1, CS2 and CE in each of the chips.

The chips C1–C4 described above are identical chips, and due to the fact that the chip selection pads and the chip selection judging circuits are provided thereon, there is no need to manufacture chips with connections modified for individual stages of the laminated layers. Due to the fact that addresses for selecting the chips may be programmed afterwards, after chips of one kind are manufactured and examined for quality products, the problems, such as, the yield of chips of a specified type being poor, chips of a specified type running short, and the like, can be eliminated.

<2. Chip Selection Judging Circuit>

FIG. 2 shows a logical circuit diagram of a chip selection judging circuit 10 provided on each of the chips. The chip selection judging circuit 10 judges, based on a chip selection signal inputted in the chip selection pads CS1, CS2, as to whether or not the corresponding chip is selected.

Figure 4:
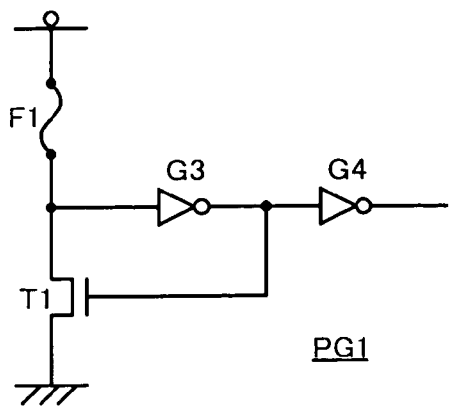
FIGS. 4(A) and 4(B) are circuit diagram indicating examples of program circuits provided in the chip selection judging circuit in FIG. 2.
Figure 4:
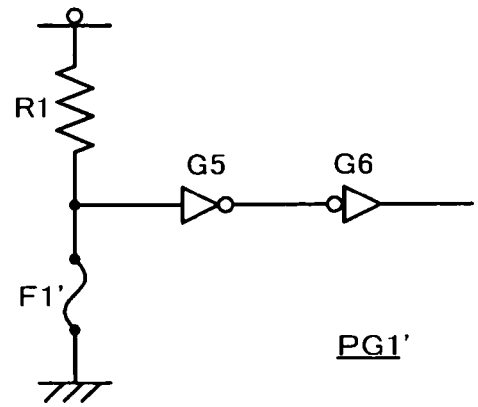

The chip selection judging circuit 10 is equipped with program circuits PG1, PG2 that are capable of programming output signals. The number of the program circuits corresponds to the number of the chip selection pads CS1, CS2. Details of the program circuits PG1, PG2 are described below with reference to FIG. 4.

The chip selection judging circuit 10 is further equipped with exclusive OR circuits EX1, EX2. A part of the chip selection signal inputted in the chip selection pad CS1 and an output of the program circuit PG1 are inputted in one of the exclusive OR circuits, EX1. Similarly, another part of the chip selection signal inputted in the chip selection pad CS2 and an output of the program circuit PG2 are inputted in the other of the exclusive OR circuits, EX2. Then, outputs of the exclusive OR circuits EX1 and EX2 are inputted in a NOR gate G1. Further, an output of the NOR gate G1 and a chip enable signal inputted in the chip enable pad CE are inputted in a NAND gate G2 in the last stage. An output of the NAND gate G2 is the last output from the chip selection judging circuit 10.

The exclusive OR circuits EX1 and EX2 each output a logical L when the signals from the chip selection pad CS1 and the program circuit PG1 match each other, and the signals from the chip selection pad CS2 and the program circuit PG2 match each other, respectively, and output a logical H when they do not match. Further, the NOR gate G1 outputs a logical H only when both of the outputs from the exclusive OR circuits EX1 and EX2 are at a logical L, and outputs a logical L when either of the outputs from the exclusive OR circuits EX1 and EX2 is at a logical H. Accordingly, only when the signals from the chip selection pads CS1 and CS2 and from the program circuits PG1 and PG2 completely match one another, the NOR gate G1 outputs a logical H.

The NAND gate G2 at the last stage outputs a signal corresponding to the chip enable signal only when the output of the NOR gate G1 is at a logical H, and outputs only a logical H regardless of the chip enable signal when the output of the NOR gate G1 is at a logical L. Accordingly, when the output of the NOR gate G1 is at a logical H, in other words, only when the signals received at the chip selection pads CS1 and CS2 and the signals from the program circuits PG1 and PG2 completely match one another, the chip enable signal becomes active in that chip.

In accordance with the present embodiment, by using two chip selection pads CS1 and CS2, a 2-bit chip selection signal can be designated. Therefore, by providing the chip selection judging circuit 10 that is equipped with two of such program circuits PG1 and PG2 on each chip, four types of chip selection signals can be identified. Accordingly, when four chips are laminated, they can be identified and any desired ones among them can be driven.

For example, if n (n is a natural number) chip selection pads CS1–CSn are used such that an n-bit chip selection signal can be designated, a chip selection judging circuit equipped with n program circuits PG1–PGn may be formed on a chip. The chip selection judging circuit in this case inputs (1) signals from the chip selection pad CS1 and the program circuit PG1, (2) signals from the chip selection pad CS2 and the program circuit PG2, . . . , and (n) signals from the chip selection pad CSn and the program circuit PGn in exclusive OR circuits EX1, EX2, . . . , and EXn, respectively. Then, by inputting their outputs in one NOR gate G1, an n-bit chip selection signal can be identified. Accordingly, even when $2^n$ chips are laminated, any desired one of the chips can be driven.

Figure 3:
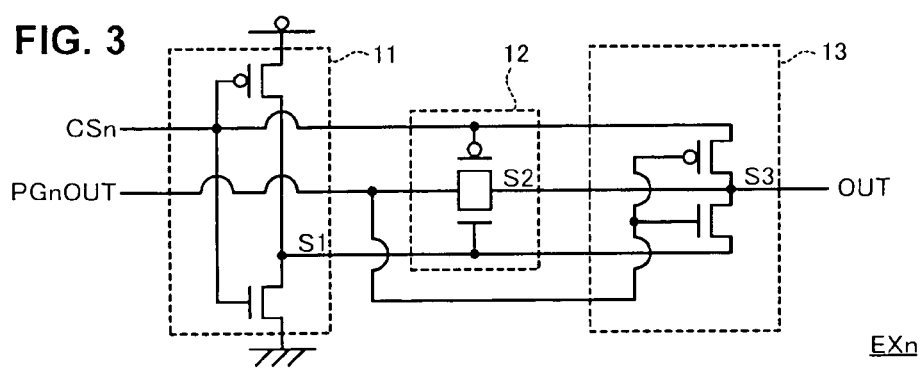
FIG. 3 is s a circuit diagram showing an example of a structure of an exclusive OR circuit formed with MOS transistors, which is used in the chip selection judging circuit in FIG. 2.

FIG. 3 is a circuit diagram showing an example of a structure of the exclusive OR circuit formed with MOS transistors, which is used in the chip selection judging circuit. The exclusive OR circuit EXn outputs a logical L from an output terminal OUT only when inputs at an input terminal CSn and an input terminal PGnOUT match each other. More specifically, the exclusive OR circuit EXn is formed from a combination of a first NOT circuit 11, a transfer gate 12 and a second NOT circuit 13.

When an input signal CSn is received at gates of a p-MOS transistor and an n-MOS transistor that are connected in series, the first NOT circuit 11 outputs a logical NOT of CSn from an output terminal S1.

The transfer gate 12 receives the input signal CSn and the logical NOT of CSn (S1) at gates of a p-MOS transistor and an n-MOS transistor that are connected in parallel, respectively, and receives an input signal PGnOUT at its source or drain. Accordingly, the transfer gate 12 outputs from an output terminal S2 a logical product of the logical NOT of CSn and the input signal PGnOUT.

The second NOT circuit 13 receives the input signal PGnOUT at gates of a p-MOS transistor and an n-MOS transistor that are connected in series, and receives the input signal CSn at a source or a drain on the p-MOS side, and the logical NOT of CSn on the n-MOS side, respectively. Accordingly, a logical product of a logical NOT of PGnOUT and the input signal CSn is outputted from an output terminal S3.

The output terminal S2 and the output terminal S3 are joined into an output OUT. Accordingly, the output OUT provides a logical H when signals on the input terminal CSn and the input terminal PGnOUT do not match each other, and a logical L when they match each other. By this, similar to the exclusive OR circuits EX1 and EX2 in FIG. 2, a matching state of the chip selection signal and the program circuit output can be judged.

Concrete structures of the exclusive OR circuit are not limited to the one described above, and variety of other circuit structures can be adopted.

<3. Program Circuit>

FIG. 4(A) is a circuit diagram indicating one example of a program circuit provided in the chip selection judging circuit in FIG. 2, and FIG. 4(B) is a circuit diagram indicating another example of a program circuit. A program circuit PG1 in FIG. 4(A) is equipped with a fuse F1 connected to a power supply terminal, an n-MOS transistor T1 having one of its terminals connected to the fuse F1, and inverters in two stages (NOT gates) G3 and G4. The other terminal of the transistor T1 is grounded. An output of the inverter G3 in the first stage is connected to a gate of the transistor T1.

When the fuse F1 is in a conductive state, a logical H is inputted in the inverter G3 at the first stage, which then outputs a logical L. The logical L is inputted in the gate of the n-MOS transistor T1, such that the signal state of the inverter G3 is maintained without a potential of the input to the inverter G3 in the first stage becoming conductive with the ground potential, and the inverter G4 in the second stage finally outputs a logical H.

In reverse, when the fuse F1 is in a nonconductive state, a logical L is inputted in the inverter G3 at the first stage, which then outputs a logical H. The logical H is inputted in the gate of the n-MOS transistor T1, such that the signal state of the inverter G3 is maintained with a potential of the input to the inverter G3 in the first stage becoming conductive with the ground potential, and the inverter G4 in the second stage finally outputs a logical L.

Accordingly, by selecting as to whether the fuse F1 is to be burnt off by a laser beam or the like in advance, or is to be used as it is, an optional signal can be outputted. Due to the fact that the fuse is used in this manner in accordance with the present embodiment, the program circuit can be formed with a simple circuit structure.

A program circuit PG1' in FIG. 4(B) is equipped with a resistor R1 connected to a power supply terminal, a fuse F1' having one of its terminals connected to the resistor, and inverters in two stages G5 and G6. The other terminal of the fuse F1' is grounded.

When the fuse F1' is in a conductive state, a logical L is inputted in the inverter G5 at the first stage, and inverted and re-inverted by the inverters G5 and G6 in two stages, whereby noise therein is removed, and a logical L is finally outputted from the inverter G6 in the second stage.

In reverse, when the fuse F1' is in a nonconductive state, a logical H is inputted in the inverter G5 in the first stage, and through the inverters in two stages, a logical H is outputted from the inverter G6 in the second stage.

The program circuit is not limited to the example described above, but may be one that is made programmable by using a nonvolatile memory device composed of ferroelectric capacitors or the like without using fuses.

<4. Relation Between Program Circuit and Chip Selection Signal>

Figure 5:
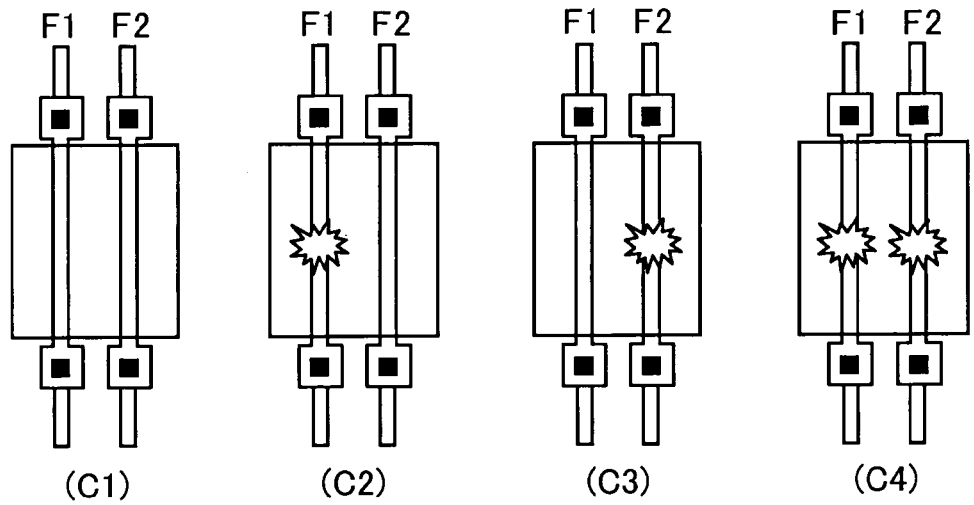
FIG. 5 are diagrams showing cut patterns of fuses.

FIG. 5 are diagrams indicating cut patterns of fuses in the program circuit. In this embodiment, a program circuit PG1 having a fuse F1 with a structure shown in FIG. 4 (A) and a program circuit PG2 having a fuse F2 with the same structure are installed in the chip selection judging circuit 10 provided on each of the chips C1–C4. In this case, for example, neither the fuse F1 or F2 is cut on the first chip C1, only the fuse F1 is cut on the second chip C2, only the fuse F2 is cut on the third chip C3, and both of the fuses F1 and F2 are cut on the fourth chip C4.

Among the four chips, when the first chip C1 is to be selected, a chip selection signal at a logical H is inputted in both of the chip selection pads CS1 and CS2. Then, the chip selection signal matches outputs of the program circuits PG1 and PG2, such that a chip enable signal that is inputted in the chip enable pad CE becomes active at the first chip C1. The signals do not match for the other chips, such that they are put in a standby state.

Similarly, when the second chip C2 is to be selected, chip selection signals at a logical L and a logical H are inputted in the chip selection pads CS1 and CS2, respectively. Then, the chip selection signals match outputs of the program circuits PG1 and PG2, such that a chip enable signal becomes active at the second chip C2.

Similarly, when the third chip C3 is to be selected, chip selection signals at a logical H and a logical L are inputted in the chip selection pads CS1 and CS2, respectively. Then, the chip selection signals match outputs of the program circuits PG1 and PG2, such that a chip enable signal becomes active at the third chip C3.

Similarly, when the fourth chip C4 is to be selected, chip selection signals at a logical L are inputted in both of the chip selection pads CS1 and CS2. Then, the chip selection signals match outputs of the program circuits PG1 and PG2, such that a chip enable signal becomes active at the fourth chip C4.

It is noted that when the chip enable signal is at a logical L, this is inputted in the NAND gate G2 of the chip selection judging circuit 10, such that all of the chips are put in a standby state regardless of the chip selection signal.

In this manner, by laminating the chips C1–C4 equipped with four kinds of cut patterns, each of the chips can be identified. Which one of the cut patterns is to be disposed on which one of the chips can be optionally decided. However, if identical cut patterns are laminated, chips cannot be identified.

If only three of the four cut patterns described above are used, and only three chips are laminated, there are only three chip selection signals that correspond to these three cut patterns. Accordingly, a chip selection signal that does not correspond to any of these chips means that all of the chips are put in a standby state. Accordingly, when there are only three chips, the chip enable signal described above becomes unnecessary, and the chip enable pad CE and the NAND gate G2 in the last stage of the chip selection judging circuit 10 on each of the chips become unnecessary. When the chip enable pad CE is made unnecessary by the method described above, n pieces of pads (n is an integer of 2 or more) may be provided for each chip, and a maximum of ($2^n-1$) pieces of chips may be laminated and each of the chips can be driven.

<5. Examples of Electronic Apparatus>

Figure 6:
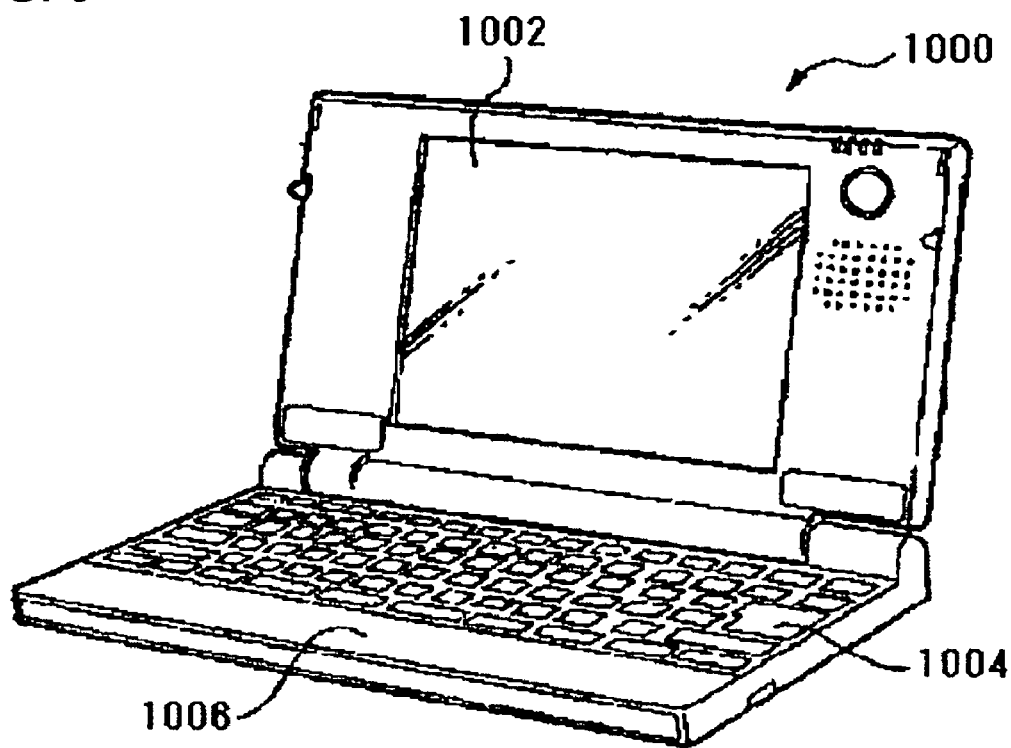
FIG. 6 is a perspective view showing a structure of a personal computer, which is an example of an electronic apparatus in accordance with an embodiment of the present invention.

FIG. 6 is a perspective view showing a structure of a personal computer 1000, which is an example of an electronic apparatus in accordance with an embodiment of the present invention. In FIG. 6, the personal computer 1000 is structured with a display panel 1002 and a main body 1006 having a keyboard 1004. As a storage medium, in particular, as a nonvolatile memory of the main body 1006 of the personal computer 1000, a laminated type semiconductor memory device in accordance with the present invention is used. For this reason, electronic apparatuses equipped with a storage means having a small area and a large capacity can be provided at low costs.

Also, the present invention is not limited to the electronic apparatus described above, and can be applied to all electronic apparatuses equipped with ferroelectric memory devices, such as, IC cards, portable information devices, home electric appliances, and the like.

The embodiment examples and application examples described above with reference to the embodiments of the present invention may be appropriately combined depending on the usages, or may be used with changes and/or improvements added thereto. The present invention is not limited to the descriptions of the embodiments above. It is clear from the description in the scope of patent claims that modes created by such combinations, changes and/or improvements can be included in the technical scope of the present invention.

What is claimed is:

1. A semiconductor memory device having a plurality of semiconductor chip layers laminated, the semiconductor memory device comprising:
   a chip selection pad provided on each of the chip layers, the chip selection pads mutually connected across the chip layers such that a chip selection signal for selecting each of the chip layers is commonly inputted in each of the chip layers,
   wherein each of the chip layers is equipped with
   a program circuit that is capable of programming an output signal, and
   a chip selection judging circuit that judges a chip selection based on the chip selection signal and an output signal of the program circuit.

2. A semiconductor memory device according to claim 1, wherein the program circuit is equipped with a fuse, and a logical circuit that is connected to the fuse and outputs a signal that differs depending on whether the fuse is cut or not cut.

3. A semiconductor memory device according to claim 1, wherein the chip selection judging circuit is equipped with an exclusive OR circuit that judges a corresponding state between the chip selection signal and an output signal of the program circuit.

4. A semiconductor memory device according to claim 1, wherein the chip selection pad in each of the chip layers is formed at an identical position in each of the chip layers.

5. A semiconductor memory device according to claim 1, wherein each of the chip layers is equipped with an identical element arrangement.

6. A semiconductor memory device according to claim 1, wherein a plurality of the chip selection pads are provided on each of the chip layers and connected to the chip selection judging circuit, wherein the corresponding chip selection pads are mutually connected across the plurality of chip layers, and
   the chip selection judging circuit is equipped with the program circuits in the number corresponding to the number of the chip selection pads, and judges a corresponding state between the chip selection signal inputted in each of the chip selection pads and an output signal of each of the corresponding program circuits.

7. A semiconductor memory device according to claim 1, further comprising:
   a chip enable pad that is provided on each of the chip layers, the chip enable pads mutually connected across the chip layers such that a chip enable signal for driving each of the chips is commonly inputted in each of the chip layers,
   wherein, when the chip selection signal and the chip enable signal are inputted, the chip enable signal is made effective in any of the chip layers where the chip selection signal matches the output signal of the program circuit.

8. An electronic apparatus characterized in comprising the semiconductor memory device recited in claim 1.

* * * * *